United States Patent
Huang et al.

(10) Patent No.: US 7,982,553 B2
(45) Date of Patent: Jul. 19, 2011

(54) CLOCK GENERATOR

(75) Inventors: Chen-Chih Huang, Hsin Chu County (TW); Tsung Yen Tsai, Ping Tung County (TW)

(73) Assignee: Realtek Semiconductor Corp., Hsinchu (TW)

( * ) Notice: Subject to any disclaimer, the term of this patent is extended or adjusted under 35 U.S.C. 154(b) by 53 days.

(21) Appl. No.: 12/466,144

(22) Filed: May 14, 2009

(65) Prior Publication Data

US 2009/0284320 A1 Nov. 19, 2009

(30) Foreign Application Priority Data

May 15, 2008 (TW) .............................. 97117775 A

(51) Int. Cl.
*H03L 1/00* (2006.01)
(52) U.S. Cl. .......... 331/186; 331/17; 331/109; 331/182; 331/183; 331/185
(58) Field of Classification Search .................... 331/17, 331/34, 57, 109, 135, 143, 182, 183, 185, 331/186; 327/535, 538
See application file for complete search history.

(56) References Cited

U.S. PATENT DOCUMENTS

| 5,180,995 | A | 1/1993 | Hayashi et al. |
| 5,994,971 | A | 11/1999 | Edwards |
| 6,882,231 | B2 * | 4/2005 | Rolandi ........................ 331/57 |
| 7,154,352 | B2 * | 12/2006 | Smith et al. .................. 331/185 |
| 2003/0090330 | A1 * | 5/2003 | Sakurai et al. ................. 331/57 |
| 2006/0114731 | A1 * | 6/2006 | Park et al. ................ 365/189.09 |
| 2008/0024198 | A1 * | 1/2008 | Bitonti et al. ................ 327/536 |
| 2008/0074170 | A1 * | 3/2008 | Hsu ............................. 327/536 |
| 2009/0115496 | A1 * | 5/2009 | Lee ............................. 327/536 |

* cited by examiner

*Primary Examiner* — Joseph Chang
*Assistant Examiner* — Jeffrey Shin
(74) *Attorney, Agent, or Firm* — Thomas, Kayden, Horstemeyer & Risley, LLP

(57) ABSTRACT

This invention discloses a clock generator capable of automatically adjusting output clock when process, voltage, or temperature variation occurred. The clock generator comprises a current generator, for generating a first current and a second current according to a control voltage; a oscillator, coupled to the current generator, for generating a clock signal according to the first current; and a voltage adjuster, coupled to the current generator and the oscillator, for adjusting the control voltage according to the clock signal and the second current; wherein, when the signal frequency of the clock signal changed, the voltage adjuster correspondingly adjusts the control voltage so as to adjust the first current.

13 Claims, 3 Drawing Sheets

CLOCK GENERATOR

BACKGROUND OF THE INVENTION (a) Field of the Invention

The present invention relates to a clock generator, and more particularly, to a clock generator that is substantially immune from the influence of manufacturing process, supply voltage, and temperature.

(b) Description of the Related Art

In an integrated circuit, the clock signal is an indispensable reference signal. The clock signal can be used as a reference signal when sampling input data, a reference clock for the arithmetic circuits, and so forth.

Generally, a clock signal used in an integrated circuit is generated from a an outside external quartz oscillator which generating a reference clock signal, and then to output the clock signal with a higher frequency by the phase lock loop of the integrated circuit according to the reference clock signal. However, although the method of generating the clock signal by the quartz oscillator can generate a more precise clock signal to be used by the integrated circuit, such a method still needs least one extra pin of the integrated circuit to receive the reference clock signal. That will cause a higher cost and hard to reduce the package area.

BRIEF SUMMARY OF THE INVENTION

In light of the above-mentioned problem, one object of the invention is to provide a clock generator, and more particularly, to a clock generator that is substantially immune from the influence of manufacturing processes, supply voltages, and temperature.

Hence, one object of the invention is to provide a clock generator to be applied in the network communication integrated circuits.

One embodiment of the invention discloses a clock generator. The clock generator includes a current generator, an oscillator, and a voltage adjuster. The current generator operates to generate a first current and a second current according to a control voltage. The oscillator, coupled to the current generator, operates to generate a clock signal according to the first current. The voltage adjuster, coupled to the current generator and the oscillator, operates to adjust the control voltage according to the clock signal and the second current. When the signal frequency of the clock signal is varied, the voltage adjuster adjusts the control voltage correspondingly according to the frequency change so as to change the first current.

DETAILED DESCRIPTION OF THE INVENTION

Figure 1:
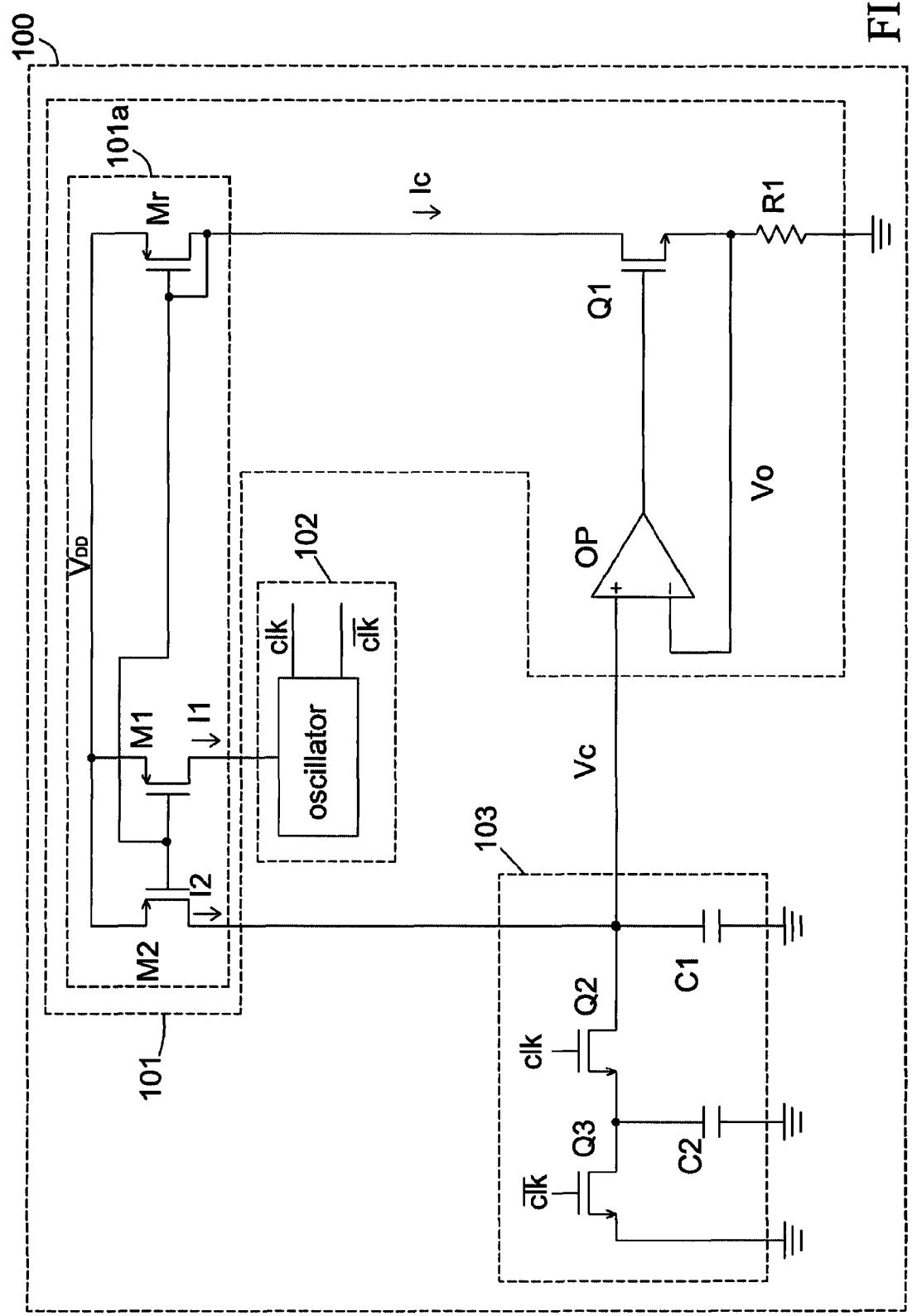
FIG. 1 shows a schematic diagram illustrating a clock generator according to an embodiment of the invention.

Reference is made to FIG. 1, which shows a schematic diagram illustrating the clock generator according to a first embodiment of the invention. As shown in this figure, the clock generator 100 includes a current generator 101, an oscillator 102, and a voltage adjuster 103. According to an embodiment of the invention, the clock generator 100 is applied in the network communication integrated circuits, such as: the 10M/100M/100M Ethernet integrated circuits, the 802.11a/b/g/n integrated circuits. The current generator 101 generates the first current I1 and the second current I2 according to the control voltage Vc. The oscillator 102, coupled to the current generator 101, generates the clock signal clk and the inverse clock signal clk according to the first current I1. The voltage adjuster 103 is coupled to the current generator 101 and the oscillator 102. The voltage adjuster 103 adjusts the control voltage Vc according to the clock signal clk, the inverse clock signal clk, and the second current I2. It should be noted that the coupling relationships between each components are shown in the figures and omitted here for sake of brevity.

The operation of the clock generator will be described in detail in the following descriptions. As shown in FIG. 1, the output terminal of the operational amplifier OP is coupled to the gate of the NMOS transistor Q1. The non-inverting input terminal receives the control voltage Vc outputted from the voltage adjuster 103. The inverting input terminal outputs an output voltage Vo and is coupled to the resistor R1 so that a control current Ic is generated when the output voltage Vo passes the resistor R1. The output voltage Vo is substantially equal to the control voltage Vc.

As shown in FIG. 1, the control current Ic flows to the current mirror circuit 101a. The transistor M1 generates the first current I1 and the transistor M2 generates the second current I2. When the aspect ratio of the transistor M1 is designed to be "b" times more than the aspect ratio of the transistor Mr, the first current I1 is substantially equal to "b" times more than the control current Ic. Similarly, when the aspect ratio of the transistor M2 is designed to be "a" times more than the aspect ration of the transistor Mr, the second current I2 is substantially equal to "a" times more than the control current Ic. As shown in FIG. 1, the source terminal of the transistor M1 is coupled to the oscillator 102. The oscillator 102 can generate the first clock signal clk and the second clock signal clk according to the first current I1 outputted by the transistor M1. According to one embodiment of the invention, the first clock signal clk and the second clock signal clk are substantially inverse to each other.

Please further refer to the voltage adjuster 103 shown in FIG. 1. According to an embodiment of the invention, the voltage adjuster 103 includes the transistor Q2, the transistor Q3, the capacitor C1, and the capacitor C2; and the coupling relationships thereof as shown in FIG. 1. The gate of the transistor Q2 is coupled to the oscillator 102 and the drain of the transistor Q2 is coupled to the first capacitor C1, wherein the conduction of transistor Q2 is is determined by the first clock signal clk. The gate of the transistor Q3 is coupled to the oscillator 102 and the drain of the transistor Q3 is coupled to the source terminal of the transistor Q2 and the second capacitor C2, wherein the conduction of the transistor Q3 is determined by the second clock signal clk.

During the first phase, that is, when the first clock signal is logic 0 and the second clock signal clk is logic 1, the transistor Q2 is operated at turned-off state while the transistor Q3 is operated at turned-on state. Meanwhile, the state of second current I2 charging the capacitor C1 can be represented as following equation:

$$aI = C_1 \frac{dv}{dt} \Rightarrow \int_0^{V1} dv = \frac{aI}{C_1} \int_0^{\frac{1}{2f}} dt \Rightarrow V_1 = \frac{aI}{C_1} \frac{1}{2f}$$

where aI is the magnitude of current of the second current I2, V1 is the voltage increase of the capacitor C1, and f is the signal frequency of the first and the second clock signals.

During the second phase, that is, when the first clock signal is logic 1 and the second clock signal $\overline{\text{clk}}$ is logic 0, the transistor Q2 is operated at turned-on state while the transistor Q3 is operated at turned-off state. When the transistor Q2 is turned-on, the charge sharing effect occurred between the capacitor C1 and the capacitor C2. The related equation of charge sharing effect can be represented as following:

$$V_1 C_1 = V_x(C_1 + C_2) \Rightarrow V_x = \frac{C_1}{C_1 + C_2} V_1$$

where Vx is a reduced voltage of capacitor C1 caused by the charge sharing effect. Hence, during the second phase, the state of the second current I2 charging the capacitor C1 can be represented by the following equations:

$$aI = (C_1 + C_2)\frac{dv}{dt} \Rightarrow \int_{V_x}^{V_2} dv = \frac{aI}{C_1 + C_2} \int_{\frac{1}{2f}}^{\frac{1}{f}} dt \Rightarrow V_2 - V_x = \frac{aI}{C_1 + C_2} \frac{1}{2f}$$

$$V_2 = V_x + \frac{aI}{C_1 + C_2} \frac{1}{2f} = \frac{C_1}{C_1 + C_2} V_1 + \frac{aI}{C_1 + C_2} \frac{1}{2f}$$

where V2 is an increased voltage of capacitor C1 during the second phase. Since the state of phase 1 and the phase 2 will repeat continuously, it can be assumed that:

$$\beta = \frac{C_1}{C_1 + C_2} \text{ and } V_C = \frac{aI}{C_1 + C_2} \frac{1}{2f}.$$

Therefore, the control voltage Vc outputted by the voltage adjuster 103 can be derived by the following equation:

$$V_{2n} = (\beta V_1 + V_C)(\beta^{n-1} + \beta^{n-2} + \ldots + 1) \Rightarrow V_C = \frac{aI}{fC_2} \quad (1)$$

Furthermore, the relationship between the control current I and the control voltage Vc can be represented by the following equation:

$$I = \frac{V_C}{R_1} \quad (2)$$

Combining the equation (1) and the equation (2), the signal frequency f of the first and the second clock signals can be derived by the following equation:

$$f = \frac{a}{R_1 C_2}.$$

The result of the above mentioned derivations clearly indicates that the signal frequency f of the first and the second clock signals generated by the oscillator 102 is related to the resistor R1, the capacitor C2, and the aspect ratio "a" of the transistor M2. It is noticed that the signal frequency f of the first and the second clock signals is substantially independent of supply voltage VDD.

Figure 2:
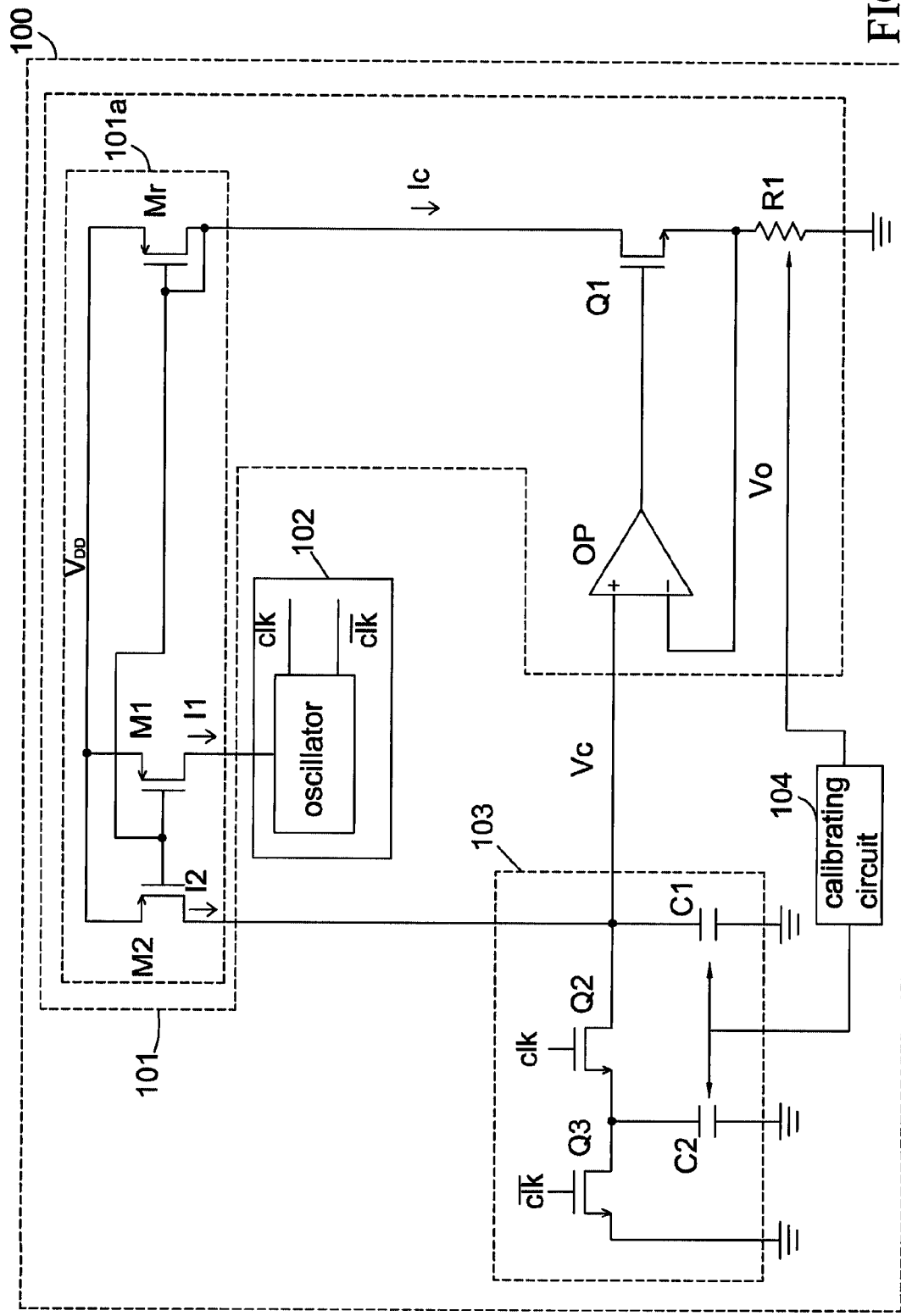
FIG. 2 shows a schematic diagram illustrating a clock generator according to an embodiment of the invention.

For example, when the supply voltage VDD drifts downward, the first current I1 and the second current I2 will be decreased due to the decrease of the Vgs. Then, the signal frequency of the first clock signal clk and the second clock signal $\overline{\text{clk}}$ outputted by the oscillator 102 also will be decreased accordingly. Due to the decrease of the signal frequency of the first clock signal clk and the second clock signal $\overline{\text{clk}}$, the voltage adjuster 103 adjusts the control voltage Vc upwardly to compensate the first current I1. Therefore, the signal frequency of the first clock signal clk and the second clock signal $\overline{\text{clk}}$ outputted by the oscillator 102 will be adjusted back to the desired situation for maintaining the stability of the clock signal. A5,AMD,M Please refer to FIG. 2, which shows a schematic diagram illustrating the clock generator according to a second embodiment of the invention. The difference between the first embodiment and the second embodiments of the invention is the addition of a calibrating circuit 104. Considering the manufacturing process and the temperature variation factors, the second embodiment of the invention further includes a calibrating circuit 104 to calibrate the capacitor C1, the capacitor C2, and the resistor R1. The coupling relationships are shown in the figure. When the manufacturing process and the temperature variation occurred, the calibrating circuit 104 calibrates the capacitor C1, the capacitor C2, or the resistor R1 to maintain the R1.times.C2 keeping in a constant value. Therefore, the clock signal outputted by the oscillator 102 can be more stable.

Figure 3:
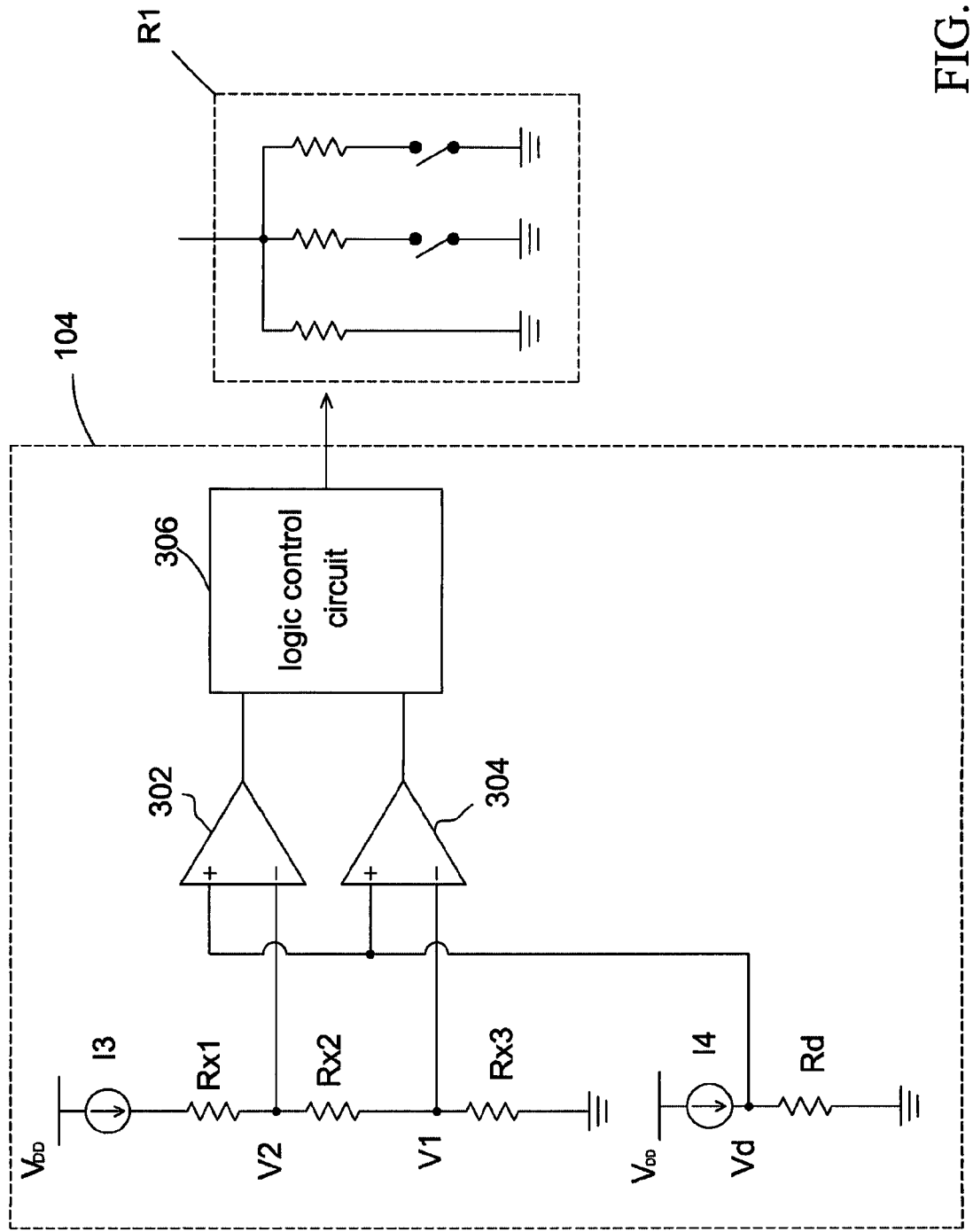
FIG. 3 shows a schematic diagram illustrating a calibrating circuit according to an embodiment of the invention.

Certain details of the calibrating circuit 104 according to an embodiment of the invention are shown in FIG. 3. The calibrating circuit 104 includes current source I3, current source I4, resistor Rx1, resistor Rx2, resistor Rx3, resistor Rd, comparator 302, comparator 304, and logic control circuit 306. The resistor Rd is used to detect the magnitudes of the manufacturing process and the temperature variation. According to the embodiment shown in FIG. 3, the current generated by current source I3 flows to the resistor Rx1, the resistor Rx2, and the resistor Rx3 for respectively generating the reference voltage V1 and the reference voltage V2 where reference voltage V1 and reference voltage V2 are independent of the manufacturing process and the temperature variation. The current generated by the current source I4 flowing to the resistor Rd is used for generating the detecting voltage Vd. Where the detecting voltage Vd is dependent of the manufacturing process and the temperature variation. Then, the detecting voltage Vd is compared to the reference voltage V1 and the reference voltage V2 respectively by the comparator 302 and the comparator 304. Next, a comparing result is outputted to the logic control circuit 306. The comparing result will reflect the variation of the manufacturing process and the temperature. Finally, the logic control circuit 306 generates the calibrating signal to the resistor R1 for calibrating the resistance according to the above mentioned comparing result. Furthermore, the approach of the calibrating circuit 104 calibrating resistor R1 can also be used to calibrate the capacitor C1 and the capacitor C2. The detail description about calibrating the capacitor C1 and the capacitor C2 is omitted herein for sake of brevity.

In conclusion, by means of the three feedback control mechanisms of the current generator 101, the oscillator 102, and the voltage adjuster 103, the clock signal outputted by the oscillator 102 of the clock generator of the invention will not be substantially influenced by the manufacturing process, the supply voltage, and the temperature. Furthermore, the clock generator of the present invention does not need external clock signal to be reference and thus saves at least one pin count of the integrated circuit.

While the invention has been described by way of examples and in terms of the preferred embodiments, it is to be understood that the invention is not limited to the disclosed embodiments. Various equivalent changes and modifications according to the claims of the present invention are to be encompassed by the scope of the present invention.

What is claimed is:

1. A clock generator, comprising:
   a current generator, for generating a first current and a second current according to a control voltage;
   an oscillator, coupled to the current generator, for generating a first clock signal according to the first current; and
   a voltage adjuster receiving both the second current and the first clock signal, the voltage adjuster adjusting the control voltage according to the first clock signal and the second current, the voltage adjuster having a voltage control output that is fed back, through intervening circuitry, to the current generator;
   wherein in response to a signal frequency of the first clock signal changed, the voltage adjuster correspondingly adjusts the control voltage so as to adjust the first current.

2. The clock generator according to claim 1, wherein the current generator comprises:
   an operational amplifier, forming part of the intervening circuitry, having an inverting input terminal, a non-inverting input terminal, and an output terminal, wherein the non-inverting input terminal is for receiving the control voltage;
   a resistor, coupled to the inverting input terminal;
   a transistor, coupled to the operational amplifier and the resistor, for outputting a control current according to the voltage of the output terminal; and
   a current mirror circuit, forming part of the current generator, coupled to the transistor, for generating the first current and the second current according to the control current.

3. The clock generator according to claim 2, further comprising:
   a calibrating circuit, coupled to the resistor, for calibrating the resistance of the resistor.

4. The clock generator according to claim 1, wherein the voltage adjuster adjusts the control voltage by a charge sharing method.

5. The clock generator according to claim 1, wherein the voltage adjuster comprises:
   a first capacitor, coupled to the current generator, for receiving the second current so as to output the control voltage;
   a first transistor, a gate of the first transistor coupled to the oscillator and a drain of the first transistor is coupled to the first capacitor, for adjusting the control voltage of the first capacitor according to the first clock signal;
   a second capacitor, coupled to a source of the first transistor, for sharing first electric charge stored in the first capacitor through the first transistor; and
   a second transistor, a gate of the second transistor is coupled to the oscillator and a drain of the second transistor is coupled to the second capacitor, for discharging second electric charge stored in the second capacitor according to a second clock signal;
   wherein the first clock signal and the second clock signal are inverse to each other.

6. The clock generator according to claim 5, wherein the second transistor is switched off when the first transistor is turned on, and the second transistor is turned on when the first transistor is switched off.

7. The clock generator according to claim 5, further comprising:
   a calibrating circuit, coupled to the first and the second capacitors, for calibrating a capacitance of the first and the second capacitors.

8. The clock generator according to claim 5, wherein the frequency of the first clock signal corresponds to a capacitance of the second capacitor.

9. The clock generator according to claim 5, wherein the first and the second transistor are NMOS transistors.

10. The clock generator according to claim 1, wherein the clock generator is applicable to a network communication device.

11. A clock generator, comprising:
    a current generator, for generating a first current and a second current according to a control voltage;
    an oscillator, coupled to the current generator, for generating a first clock signal according to the first current; and
    a voltage adjuster receiving both the second current and the first clock signal, the voltage adjuster adjusting the control voltage according to the first clock signal and the second current, the voltage adjuster having a voltage control output;
    an operational amplifier having an inverting input terminal, a non-inverting input terminal, and an output terminal, wherein the non-inverting input terminal is connected to the voltage control output;
    a resistor coupled between the non-inverting input terminal and ground; and
    a transistor having a gate connected to the output terminal and a source connected to the current generator.

12. The clock generator according to claim 11, wherein the resistor is a variable resistor, the clock generator further comprising a calibrating circuit having an output that is connected to the variable resistor to control a variable resistance value thereof.

13. A clock generator, comprising:
    a current generator, for generating a first current and a second current according to a control voltage, the current generator comprising a current mirror;
    an oscillator, coupled to the current generator, for generating a first clock signal according to the first current; and
    a voltage adjuster receiving both the second current and the first clock signal, the voltage adjuster adjusting the control voltage according to the first clock signal and the second current, the voltage adjuster having a voltage control output;
    a transistor coupled to the voltage control output, the transistor having a source connected to the current mirror, wherein the current mirror operates to generate the first current and the second current according to a control current that passes through the source of the transistor.

* * * * *